United States Patent
Chen et al.

(10) Patent No.: US 7,696,060 B2
(45) Date of Patent: Apr. 13, 2010

(54) RECYCLABLE STAMP DEVICE AND RECYCLABLE STAMP PROCESS FOR WAFER BOND

(75) Inventors: Jiunn Chen, Kaohsiung (TW); Meng-Jen Wang, Pingtung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 42 days.

(21) Appl. No.: 12/003,408

(22) Filed: Dec. 26, 2007

(65) Prior Publication Data

US 2008/0157406 A1 Jul. 3, 2008

(30) Foreign Application Priority Data

Dec. 28, 2006 (TW) .............................. 95149530 A

(51) Int. Cl.
*H01L 21/76* (2006.01)
(52) U.S. Cl. ............... 438/411; 257/797; 257/E21.211; 257/E23.179; 438/455
(58) Field of Classification Search ............. 257/797, 257/773, 737; 438/48, 458, 411, 22, 174, 438/123, 109
See application file for complete search history.

(56) References Cited

U.S. PATENT DOCUMENTS

| 7,351,641 | B2 * | 4/2008 | Haba et al. ............ 438/411 |
| 7,476,972 | B2 * | 1/2009 | Takahashi ............. 257/773 |
| 2003/0127734 | A1 * | 7/2003 | Lee et al. .............. 257/737 |
| 2003/0132524 | A1 * | 7/2003 | Felmetsger ........... 257/766 |
| 2004/0253809 | A1 * | 12/2004 | Yao et al. ............. 438/631 |
| 2005/0260796 | A1 | 11/2005 | Takahashi |
| 2006/0033189 | A1 | 2/2006 | Haba et al. |

OTHER PUBLICATIONS

Quirk, Semiconductor Manufacturing Technology, 2001, "Metal Deposition Systems", pp. 313-315.*

* cited by examiner

*Primary Examiner*—Thanh V Pham
*Assistant Examiner*—Errol Fernandes
(74) *Attorney, Agent, or Firm*—Bacon & Thomas, PLLC

(57) ABSTRACT

A recyclable stamp device and a recyclable stamp process for wafer bond are provided. The recyclable stamp device includes a substrate, a protective layer, a stack film structure and a cap. The protective layer is disposed on the substrate. An opening is positioned at the substrate and the protective layer to expose the substrate. The stack film structure includes an adhesion layer, a stress control layer and a wafer bond alignment mark layer. The adhesion layer is disposed on the protective layer and the exposed substrate. The stress control layer is disposed on the adhesion layer. The wafer bond alignment mark layer is disposed on the stress control layer. The wafer bond alignment mark layer includes an alignment mark at a side of the opening. The cap has a capping portion disposed on the wafer bond alignment mark layer corresponding to the opening.

20 Claims, 6 Drawing Sheets

RECYCLABLE STAMP DEVICE AND RECYCLABLE STAMP PROCESS FOR WAFER BOND

This application claims the benefit of Taiwan application Serial No. 95149530, filed Dec. 28, 2006, the subject matter of which is incorporated herein by reference.

BACKGROUND OF THE INVENTION

1. Field of the Invention

The invention relates in general to a stamp device and a process for wafer bond, and more particularly to a recyclable stamp device and a recyclable stamp process for wafer bond.

2. Description of the Related Art

The wafer bond process is widely applied to all kinds of fields, such as micro electro mechanical system (MEMS) manufacturing process and the manufacture of optoelectronic elements. The wafer bond process, which is performed before the wafer saw process, is a wafer-level bonding technology, so the wafer bond process is different from other packaging methods which perform the wafer saw process before the bonding process.

Accurate alignment is needed before the wafer bond process is performed, so that the wafers can be bonded at the precise location. Traditionally, the alignment is performed through an alignment mark which is a concave structure formed by etching. However, the etching rate of etching the substrate is affected by the crystallization direction of the substrate, so that the alignment mark is deformed. As a result, the alignment accuracy is lowered.

Furthermore, the alignment mark is usually worn out or disappears as the manufacturing process proceeds. If the wafer with the alignment worn out or disappearing is utilized again to perform the wafer bond process, another alignment mark or another wafer is needed, so that the time and the cost of the manufacturing process are increased.

SUMMARY OF THE INVENTION

The invention is directed to a recyclable stamp device and a recyclable stamp process for wafer bond. Through the recyclable stamp process, the recyclable stamp device is reusable so as to reduce the time and the cost of the manufacturing process.

According to a first aspect of the present invention, a recyclable stamp device for wafer bond is provided. The recyclable stamp device includes a substrate, a protective layer, a stack film structure and a cap. The protective layer is disposed on the substrate. An opening is positioned at the substrate and the protective layer to expose the substrate. The stack film structure includes an adhesion layer, a stress control layer and a wafer bond alignment mark layer. The adhesion layer is disposed on the protective layer and the exposed substrate. The stress control layer is disposed on the adhesion layer. The wafer bond alignment mark layer is disposed on the stress control layer. The wafer bond alignment mark layer includes an alignment mark at a side of the opening. The cap has a capping portion disposed on the wafer bond alignment mark layer corresponding to the opening.

According to a second aspect of the present invention, a recyclable stamp process for wafer bond is provided. The recyclable stamp process includes the following steps. First, a recyclable stamp device including a cap and a stack film structure is provided. The stack film structure includes an adhesion layer, a stress control layer and a wafer bond alignment mark layer. The adhesion layer, the stress control layer, the wafer bond alignment mark layer and the cap are formed sequentially. The wafer bond alignment mark layer includes a first alignment mark. Next, a wafer including a second alignment mark is provided. Then, the first alignment mark and the second alignment mark are aligned. After that, the cap of the recyclable stamp device is capped on the wafer and the recyclable stamp device and the wafer are bonded. Then, the cap is released so as to separate the cap and the recyclable stamp device. After that, another cap is formed on the wafer bond alignment mark layer for reusing the recyclable stamp device.

The invention will become apparent from the following detailed description of the preferred but non-limiting embodiments. The following description is made with reference to the accompanying drawings.

DETAILED DESCRIPTION OF THE INVENTION

Figure 1A:
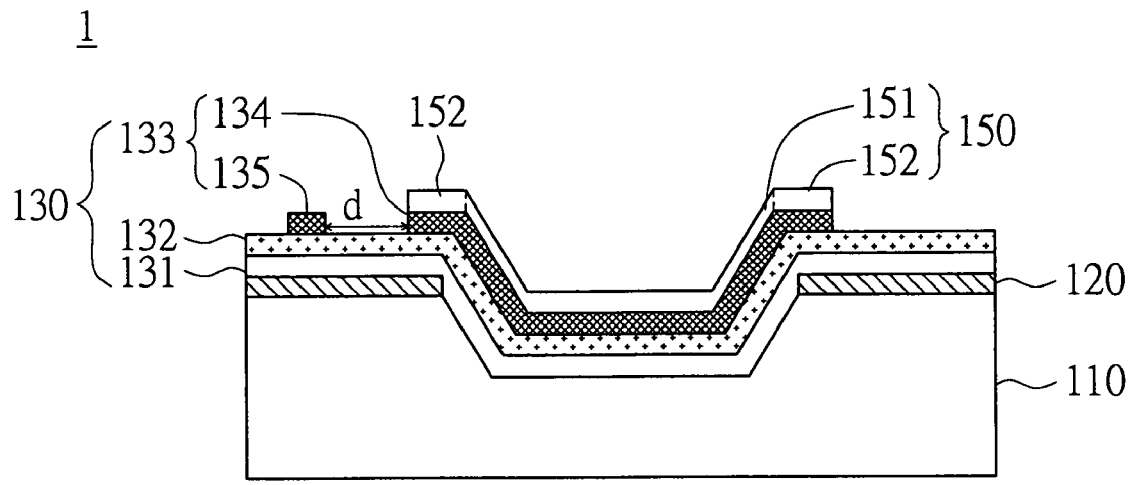
FIGS. 1A~1H illustrate a recyclable stamp process for wafer bond according to a preferred embodiment of the present invention.
Figure 1B:
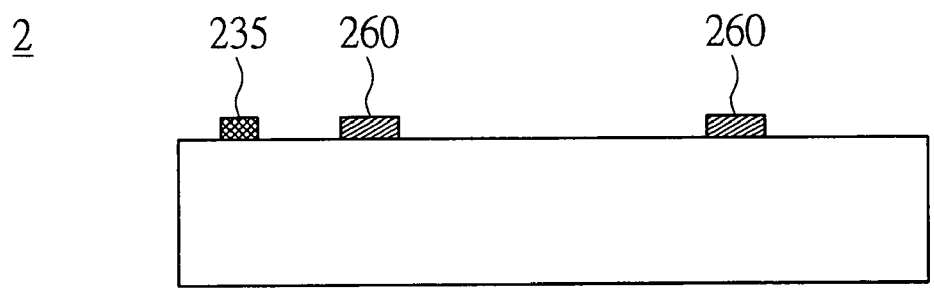
Figure 1C:
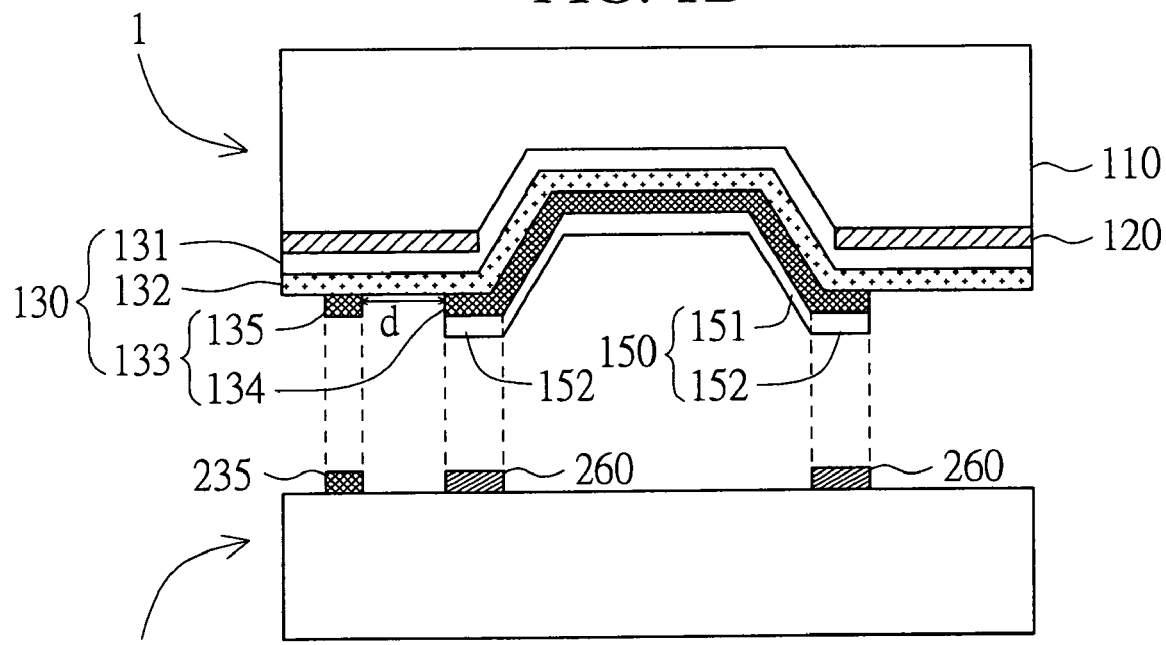
Figure 1D:
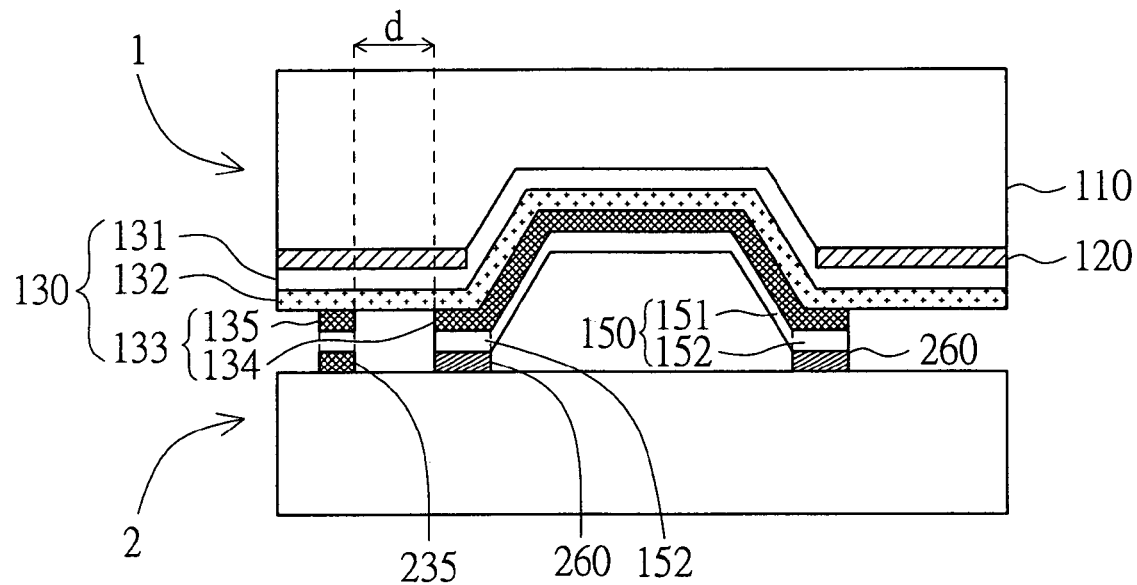
Figure 1E:
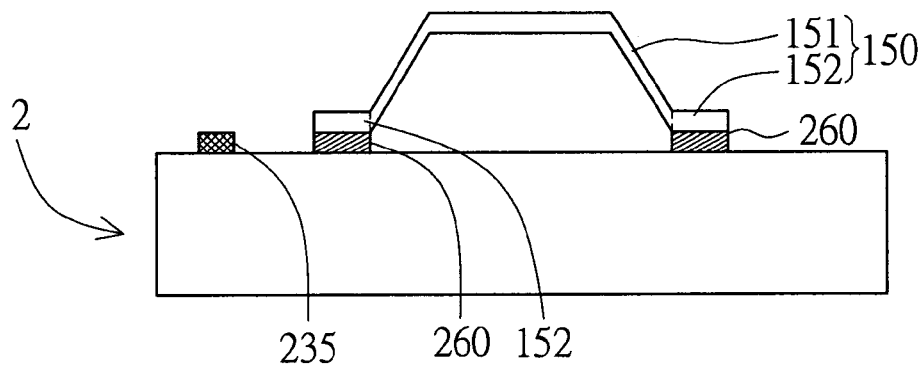
Figure 1F:
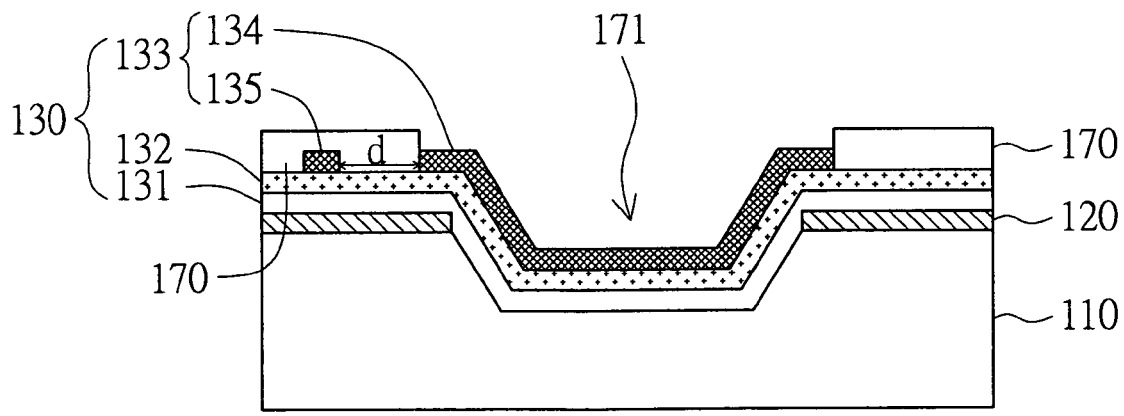
Figure 1G:
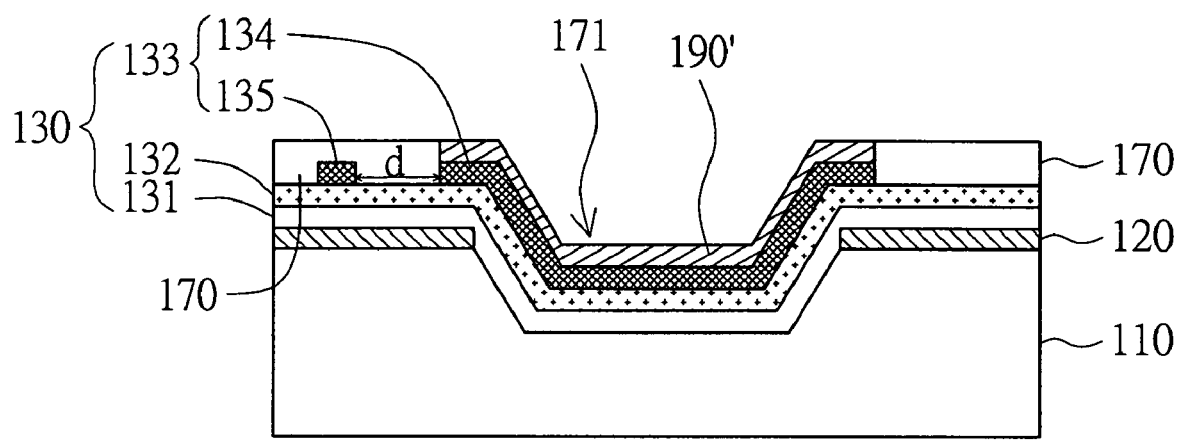
Figure 1H:
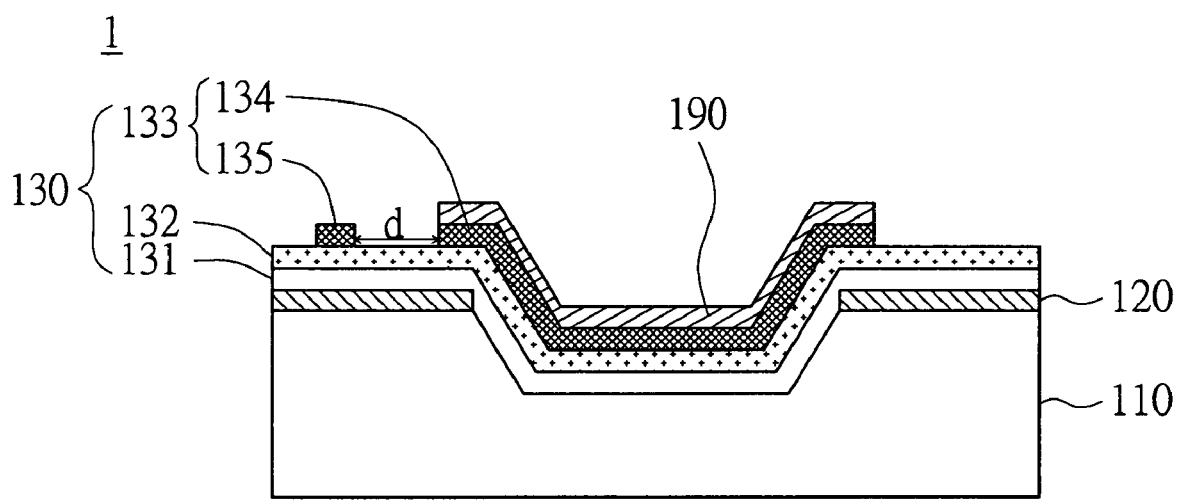
Figure 2:
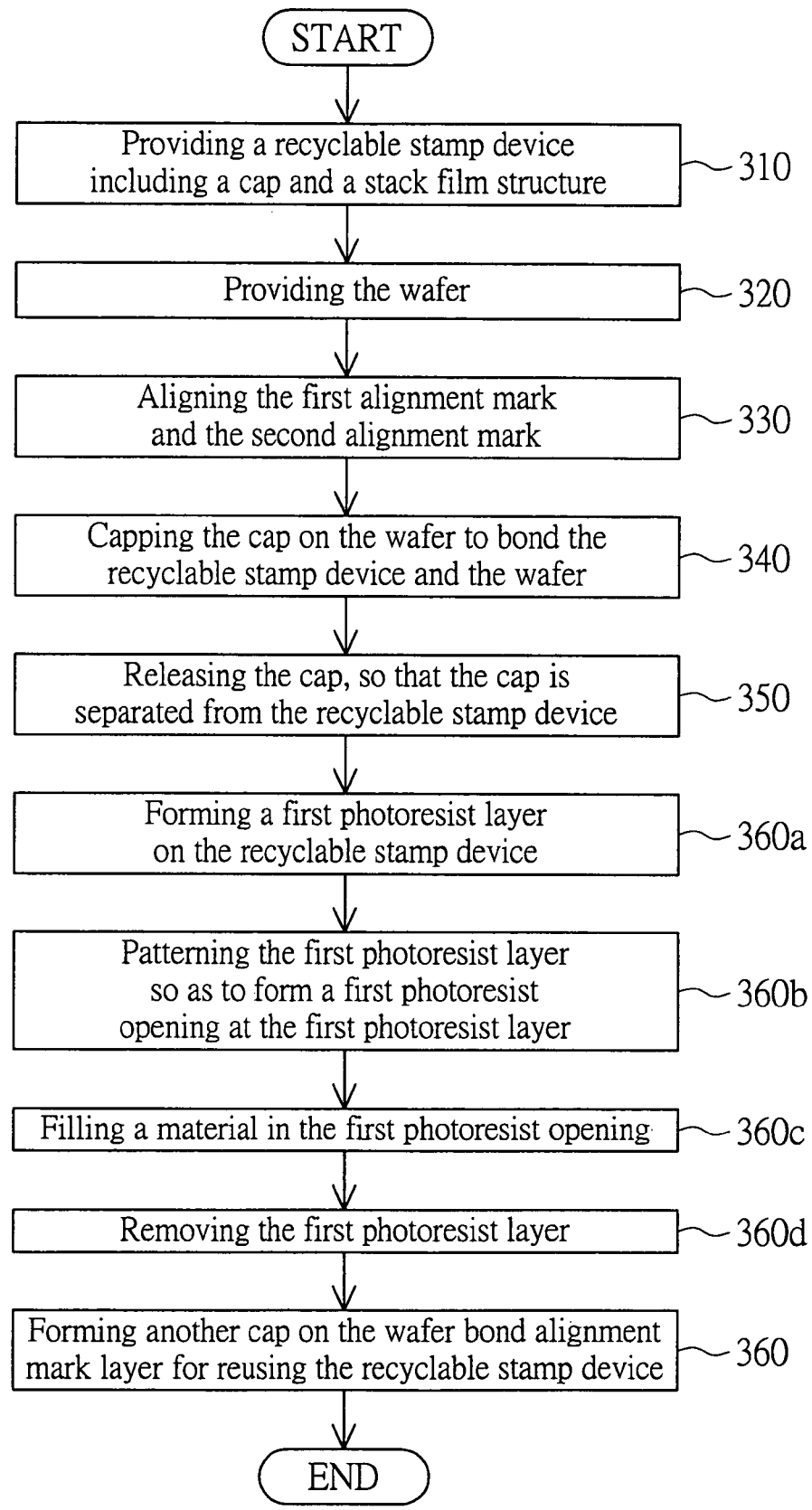
FIG. 2 is a flow chart of the recyclable stamp process for wafer bond according to the preferred embodiment of the present invention.

Referring to FIGS. 1A~1H and FIG. 2, FIGS. 1A~1H illustrate a recyclable stamp process for wafer bond according to a preferred embodiment of the present invention and FIG. 2 is a flow chart of the recyclable stamp process for wafer bond according to the preferred embodiment of the present invention.

Figure 3:
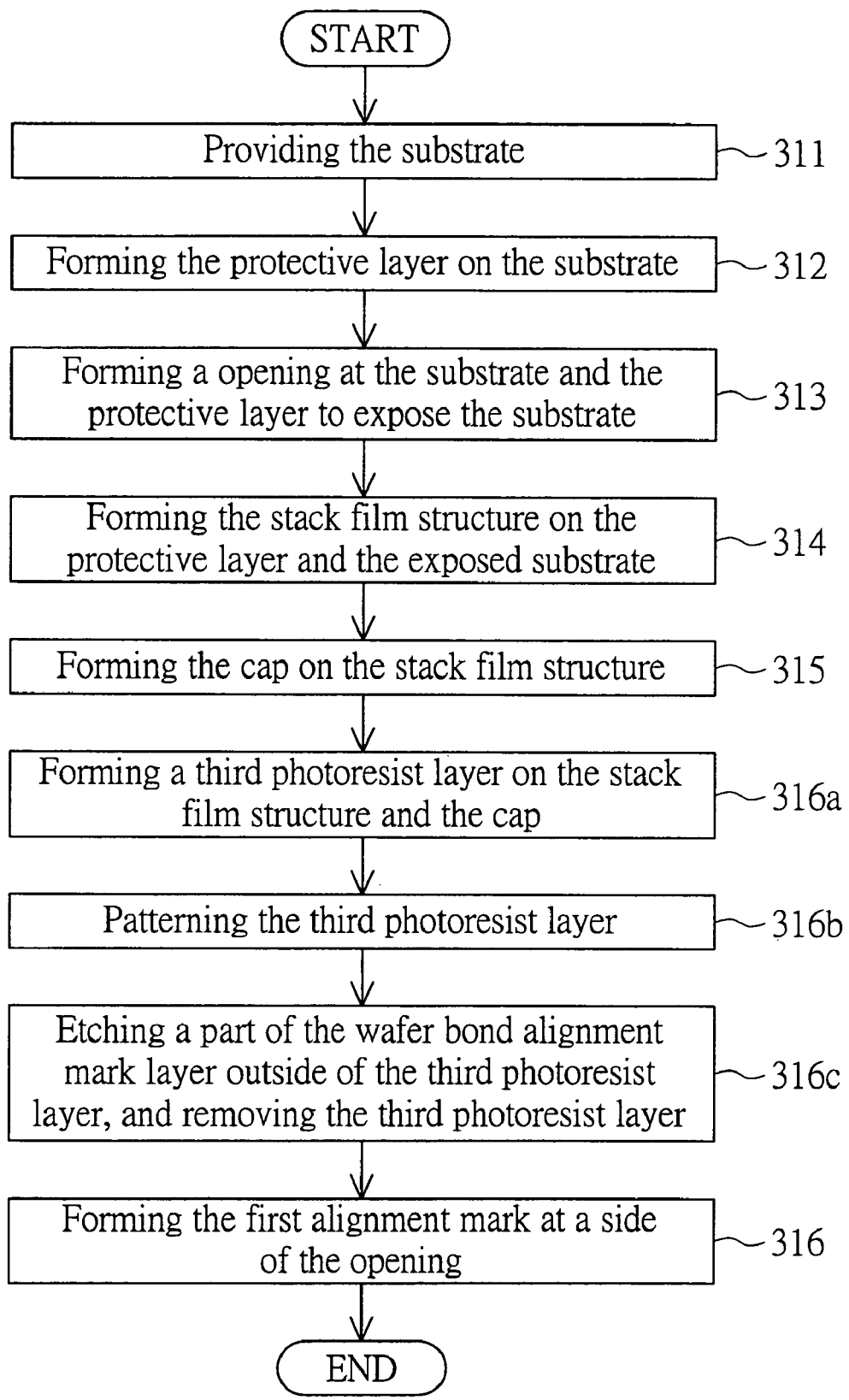
FIG. 3 is a flow chart of a manufacturing method of the recyclable stamp device.

First, as shown in FIG. 1A and FIG. 2, a recyclable stamp device 1 is provided in the step 310. The recyclable stamp device 1 includes a substrate 110, a protective layer 120, a stack film structure 130 and a cap 150. A manufacturing method of the recyclable stamp device 1 is exemplified in FIG. 3. FIG. 3 is a flow chart of a manufacturing method of the recyclable stamp device. In the step 311, the substrate 110 is provided. Then, in the step 312, the protective layer 120 is formed on the substrate 110. After that, in the step 313, an opening is formed at the substrate 110 and the protective layer 120 to expose the substrate 110. In the present embodiment, the width of the bottom of the opening is less than the wide of the top of the opening, and the protective layer 120 is, for example, made of silicon dioxide.

Then, in the step 314, the stack film structure 130 is formed on the protective layer 120 and the exposed substrate 110. The stack film structure 130 includes an adhesion layer 131, a stress control layer 132 and a wafer bond alignment mark layer 133. The adhesion layer 131, the stress control layer 132 and the wafer bond alignment mark 133 are sequentially formed. The adhesion layer 131, the stress control layer 132 and the wafer bond alignment mark layer 133 are, for example, formed by physical vapor disposition. The adhesion layer 131 is disposed on the protective layer 120 and the exposed substrate 110 for closely connecting the protective layer 120 and the stress control layer 132. The stress control layer 132 is disposed on the adhesion layer 131 for buffering the stress generated by the adhesion layer 131 and the wafer bond alignment mark layer 133. As a result, the warpage of the recyclable stamp device 1 can be avoided. The wafer bond alignment mark layer 133 including a seed layer 134 and a first alignment mark 135 is disposed on the stress control layer 132.

Figure 4:
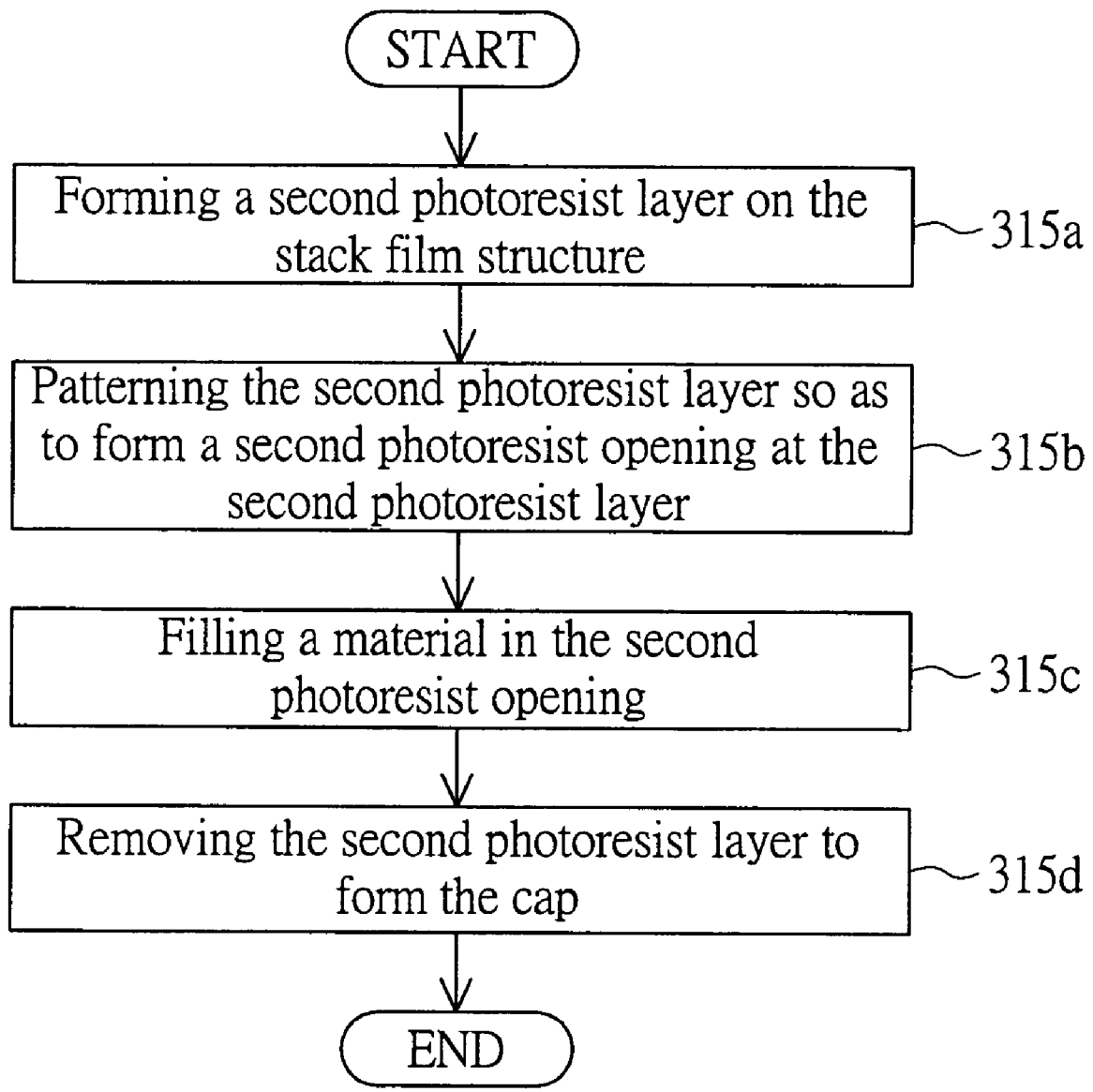
FIG. 4 is a flow chart of a method of forming the cap on the stack film structure.

After the step 314 in FIG. 3 is performed, the cap 150 is formed on the stack film structure 130 in the step 315. As shown in FIG. 1A, the cap 150 is formed on the seed layer 134 of the stack film structure 130 for capping a wafer 2 in FIG. 1B. Referring to FIG. 4, FIG. 4 is a flow chart of a method of forming the cap on the stack film structure. The method of forming the cap on the stack film structure is exemplified by the following steps. First, a second photoresist layer is formed on the stack film structure 130 in the step 315a. Next, the second photoresist layer is patterned in the step 315b so as to form a second photoresist opening at the second photoresist layer. Then, the second photoresist opening is filled with a material in the step 315c. Afterwards, the second photoresist layer is removed to form the cap 150 in the step 315d. In the present embodiment, the second photoresist layer is a negative photoresist, and the material is filled in the second photoresist opening by electroplating in the step 315c.

As shown in FIG. 1A, the cap 150 has a capping portion 151 and a bonding portion 152. The capping portion 151 is disposed on the wafer bond alignment mark layer 133 corresponding to the opening. The bonding portion 152 is connected to a periphery of the capping portion 151 and is disposed on the wafer bond alignment mark layer 133. In the present embodiment, the bonding portion 152 and the first alignment mark 135 are spaced at an interval d.

After the cap 150 is formed in the step 315 (as shown in FIG. 3) by the exemplary method in FIG. 4, the recyclable stamp process in FIG. 3 proceeds to the step 316a. In the step 316a, a third photoresist layer is formed on the stack film structure 130 and the cap 150 in the step 316a. Then, the third photoresist layer is patterned in the step 316b. After that, a part of the wafer bond alignment mark layer 133 outside of the third photoresist layer is etched, and the third photoresist layer is removed in the step 316c. Then, the first alignment mark 135 is formed at a side of the opening in the step 316. The first alignment mark 135 is used for accurately aligning the recyclable stamp device 1 and the wafer 2 (as shown in FIG. 1B) before the wafer bond is performed. In the present embodiment, the first alignment mark 135 is a convex structure, and the third photoresist layer is a positive photoresist.

The adhesion layer 131 is, for example, made of aluminum (Al), titanium (Ti), titanium-tungsten (TiW) or the combination thereof. The stress control layer 132 is made of nickel-vanadium (NiV). The wafer bond alignment mark layer 133 is made of nickel-vanadium, nickel (Ni) titanium or the combination thereof. The cap 150 is made of copper (Cu) or nickel.

After the recyclable stamp device 1 is provided in the step 310 (as shown in FIG. 2), the wafer 2 (as shown in FIG. 1B) is provided in the step 320 shown in FIG. 2. The wafer 2 includes pads 260 and a second alignment mark 235. The pads 260 are disposed with respect to the bonding portion 152 of the recyclable stamp device 1 (as shown in FIG. 1A). The second alignment mark 235 is disposed with respect to the first alignment mark 135 (as shown in FIG. 1A).

Then, as shown in FIG. 1C, the first alignment mark 135 and the second alignment mark 235 are aligned in the step 330 (as shown in FIG. 2), so that the recyclable stamp device 1 and the wafer 2 are bonded at the precise location.

After that, as shown in FIG. 1D, the cap 150 of the recyclable stamp device 1 is capped on the wafer 2 to bond the bonding portion 152 of the cap 150 of the recyclable stamp device 1 and the pads 260 of the wafer 2 (in the step 340 in FIG. 2).

Then, as shown in FIG. 1E, the cap 150 is released in the step 350. As a result, the cap 150 is separated from the wafer bond alignment mark layer 133 of the recyclable stamp device 1 (as shown in FIG. 1D).

After that, as shown in FIG. 1F, a first photoresist layer 170 is formed on the recyclable stamp device 1 in the step 360a. Then, in the step 360b, the first photoresist layer 170 is patterned so as to form a first photoresist opening 171 at the first photoresist layer 170.

After that, as shown in FIG. 1G, a material 190' is filled in the first photoresist opening 171 in the step 360c in FIG. 2.

Then, as shown in FIG. 1H, the first photoresist layer 170 is removed to form another cap 190 in the steps 360d and 360. As a result, the recyclable stamp device 1 can be reused after forming the cap 190 in the recyclable stamp process. The first photoresist layer 170 (as shown in FIG. 1F) is a negative photoresist, and the material 190' (as shown in FIG. 1G) is filled in the first photoresist opening 171 (as shown in FIG. 1G) by electroplating.

The recyclable stamp device of the present embodiment of the invention includes the stack film structure including the stress control layer, the adhesion layer and the wafer bond alignment mark layer. The stress control layer is used for buffering the stress generated by the adhesion layer and the wafer bond alignment mark layer, so that the warpage of the recyclable stamp device can be avoided. The adhesion layer is used for closely connecting the protective layer and the stress control layer. Therefore, the recyclable stamp device has the advantage of not deforming easily so as to be reused in the stamp process, which reduces the time and the cost of the manufacturing process.

Furthermore, the first alignment mark of the recyclable stamp device is formed on the wafer bond alignment mark layer of the stack film structure. Therefore, there is no need to reproduce another first alignment mark when the recyclable stamp device is reused. Thus, the cost and the time of the reproduction of another first alignment mark can be saved. Moreover, the first alignment mark is a convex structure, which avoids the alignment mark being deformed or disappearing during the manufacturing process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A recyclable stamp device for wafer bond, comprising:
   a substrate;
   a protective layer disposed on the substrate, wherein an opening is positioned at the substrate and the protective layer to expose the substrate;
   a stack film structure comprising:
      an adhesion layer disposed on the protective layer and the exposed substrate;
      a stress control layer disposed on the adhesion layer; and
      a wafer bond alignment mark layer disposed on the stress control layer, wherein the wafer bond alignment mark layer comprises an alignment mark at a side of the opening; and
   a cap having a capping portion disposed on the wafer bond alignment mark layer corresponding to the opening.

2. The recyclable stamp device according to claim 1, wherein the wafer bond alignment mark layer further comprises a seed layer, and the cap is disposed on the seed layer.

3. The recyclable stamp device according to claim 1, wherein the cap further has a bonding portion connected to a periphery of the capping portion and disposed on the wafer bond alignment mark layer.

4. The recyclable stamp device according to claim 3, wherein the alignment mark and the bonding portion are spaced at an interval.

5. The recyclable stamp device according to claim 1, wherein the cap is made of copper (Cu) or nickel (Ni).

6. The recyclable stamp device according to claim 1, wherein the material of the wafer bond alignment mark layer is selected from a group consisting of nickel-vanadium (NiV), nickel, titanium (Ti) and the combination thereof.

7. The recyclable stamp device according to claim 1, wherein the alignment mark is a convex structure.

8. The recyclable stamp device according to claim 1, wherein the width of the bottom of the opening is less than the width of the top of the opening.

9. The recyclable stamp device according to claim 1, wherein the protective layer is made of silicon dioxide.

10. The recyclable stamp device according to claim 1, wherein the stress control layer is made of nickel-vanadium.

11. A recyclable stamp process for wafer bond, comprising:
  providing a recyclable stamp device comprising a cap and a stack film structure, wherein the stack film structure comprises an adhesion layer, a stress control layer and a wafer bond alignment mark layer, the adhesion layer, the stress control layer, the wafer bond alignment mark layer and the cap are formed sequentially and the wafer bond alignment mark layer comprises a first alignment mark;
  providing a wafer comprising a second alignment mark;
  aligning the first alignment mark and the second alignment mark;
  capping the cap of the recyclable stamp device on the wafer to bond the recyclable stamp device and the wafer;
  releasing the cap so as to separate the cap and the stack film structure; and
  forming another cap on the wafer bond alignment mark layer for reusing the recyclable stamp device.

12. The recyclable stamp process according to claim 11, wherein the step of bonding the recyclable stamp device and the wafer comprises:
  bonding a bonding portion of the cap with a pad of the wafer.

13. The recyclable stamp process according to claim 11, wherein the step of forming the another cap comprises:
  forming a first photoresist layer on the recyclable stamp device;
  patterning the first photoresist layer so as to form a first photoresist opening at the first photoresist layer;
  filling a material in the first photoresist opening; and
  removing the first photoresist layer to form the another cap.

14. The recyclable stamp process according to claim 13, wherein the material is filled in the first photoresist opening by electroplating.

15. The recyclable stamp process according to claim 11, wherein the step of providing the recyclable stamp device comprises:
  providing a substrate;
  forming a protective layer on the substrate;
  forming an opening at the substrate and the protective layer to expose the substrate;
  forming the stack film structure on the protective layer and the exposed substrate;
  forming the cap on the stack film structure; and
  forming the first alignment mark at a side of the opening.

16. The recyclable stamp process according to claim 15, wherein the step of forming the stack film structure on the protective layer and the exposed substrate comprises:
  forming the adhesion layer on the protective layer and the exposed substrate;
  forming the stress control layer on the adhesion layer; and
  forming the wafer bond alignment mark layer on the stress control layer.

17. The recyclable stamp process according to claim 16, wherein the adhesion layer, the stress control layer and the wafer bond alignment mark layer are formed by physical vapor deposition.

18. The recyclable stamp process according to claim 15, wherein the step of forming the cap on the stack film structure comprises:
  forming a second photoresist layer on the stack film structure;
  patterning the second photoresist layer so as to form a second photoresist opening at the second photoresist layer,
  filling a material in the second photoresist opening; and
  removing the second photoresist layer to form the cap.

19. The recyclable stamp process according to claim 18, wherein the material is filled in the second photoresist opening by electroplating.

20. The recyclable stamp process according to claim 15, wherein the step of forming the first alignment mark at the side of the opening comprises:
  forming a third photoresist layer on the stack film structure and the cap;
  patterning the third photoresist layer; and
  etching a part of the wafer bond alignment mark layer outside of the third photoresist layer and removing the third photoresist layer to form the first alignment mark.

* * * * *